United States Patent
Fujita

(10) Patent No.: US 8,183,958 B2
(45) Date of Patent: May 22, 2012

(54) ELASTIC-WAVE LADDER FILTER

(75) Inventor: Shigeyuki Fujita, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/226,638

(22) Filed: Sep. 7, 2011

(65) Prior Publication Data

US 2011/0316648 A1   Dec. 29, 2011

Related U.S. Application Data

(63) Continuation of application No. PCT/JP2010/051685, filed on Feb. 5, 2010.

(30) Foreign Application Priority Data

Mar. 10, 2009  (JP) ................................. 2009-056343

(51) Int. Cl.
*H03H 9/64* (2006.01)
*H03H 9/72* (2006.01)

(52) U.S. Cl. .......................... 333/133; 333/193; 333/195

(58) Field of Classification Search .......... 333/193–196, 333/133; 310/313 R
See application file for complete search history.

(56) References Cited

U.S. PATENT DOCUMENTS

| | | | |
|---|---|---|---|
| 5,631,612 A | 5/1997 | Satoh et al. | |
| 6,031,435 A * | 2/2000 | Inose et al. | 333/193 |
| 2005/0025324 A1 | 2/2005 | Takata | |
| 2009/0002097 A1 | 1/2009 | Takamine | |

FOREIGN PATENT DOCUMENTS

| | | |
|---|---|---|
| JP | 10-242799 A | 9/1998 |
| JP | 2000-174586 A | 6/2000 |
| JP | 2005-45475 A | 2/2005 |
| JP | 2007-209024 A | 8/2007 |
| WO | 2007/116760 A1 | 10/2007 |

OTHER PUBLICATIONS

Official Communication issued in International Patent Application No. PCT/JP2010/051685, mailed on Mar. 16, 2010.

* cited by examiner

*Primary Examiner* — Barbara Summons
(74) *Attorney, Agent, or Firm* — Keating & Bennett, LLP

(57) ABSTRACT

An elastic-wave ladder filter significantly reduces loss within a passband while also increasing the passband and attenuation. The elastic-wave ladder filter includes a series arm that connects an input end and an output end and a parallel arm that connects the series arm and a ground potential. The series arm includes at least three series arm resonators connected to each other in series. The resonant frequencies of the at least three series arm resonators differ from each other. An aspect ratio of the series arm resonator having the lowest resonant frequency is larger than an average of the aspect ratios of all the series arm resonators when the aspect ratio is defined as a ratio of an overlap width of electrode fingers of a series arm resonator to a number of pairs of the electrode fingers.

8 Claims, 7 Drawing Sheets

WHEN Rx IS OF BALANCED OUTPUT TYPE

*Rx FILTER CAN BE OF LONGITUDINALLY COUPLED TYPE OR OF LADDER TYPE

WHEN Rx IS OF UNBALANCED OUTPUT TYPE

ELASTIC-WAVE LADDER FILTER

BACKGROUND OF THE INVENTION

1. Field of the Invention

The present invention relates to elastic-wave filters used for, for example, band-pass filters of cellular phones, and in particular, relates to elastic-wave filters including ladder circuit structures.

2. Description of the Related Art

To date, surface-acoustic-wave filters have been widely used as band-pass filters of cellular phones for RF stages. Japanese Unexamined Patent Application Publication No. 2000-174586, for example, discloses a surface-acoustic-wave ladder filter as an example of such band-pass filters. In such a surface-acoustic-wave ladder filter, the resonant frequency $fr_s$ of series arm resonators and the antiresonant frequency $fa_p$ of parallel arm resonators are set adjacent to the central frequency in a passband. On the other hand, the antiresonant frequency $fa_s$ of the series arm resonators is set at an attenuation pole adjacent to a high frequency region of the passband, and the resonant frequency $fr_p$ of the parallel arm resonators is set at an attenuation pole adjacent to a low frequency region of the passband. This forms the passband.

As described in paragraph [0297] in Japanese Unexamined Patent Application Publication No. 2000-174586, the aperture, i.e., the overlap width of electrode fingers of an IDT electrode of the series arm resonators is reduced and the number of pairs of electrode fingers of the series arm resonators is increased. With this, electrical resistance is reduced, and as a result, loss can be reduced. Moreover, as described in paragraph [0300] in Japanese Unexamined Patent Application Publication No. 2000-174586, loss caused by diffraction of surface acoustic waves is increased when the overlap width is extremely reduced. However, the diffraction loss more greatly affects the antiresonance characteristics than the resonance characteristics. Therefore, the diffraction loss does not cause serious problems to the series arm resonators having a resonant frequency $fr_s$ located adjacent to the central frequency of the passband and an antiresonant frequency $fa_s$ located outside the passband since the effect thereof is small. Therefore, the overlap width is usually reduced as much as possible.

Recently, extension of passbands, increase in attenuation, and reduction in loss have been strongly demanded for band-pass filters of cellular phones. To this end, the resonant frequencies of a plurality of series arm resonators are made different from each other so that the passbands and the attenuation are increased.

When the resonant frequencies of the series arm resonators differ from each other, however, the loss within the passbands cannot be sufficiently reduced. In particular, the loss in a high frequency region within the passband is disadvantageously increased.

SUMMARY OF THE INVENTION

In view of the above problems, preferred embodiments of the present invention provide an elastic-wave ladder filter with an increased passband and increased attenuation in a stopband adjacent to the passband, and with greatly reduced loss within the passband.

According to a preferred embodiment of the present invention, an elastic-wave ladder filter includes a series arm that connects an input end and an output end and a parallel arm that connects the series arm and a ground potential. The series arm includes at least three series arm resonators connected to each other in series, the resonant frequencies of the at least three series arm resonators differ from each other, and an aspect ratio T1 of the series arm resonator having the lowest resonant frequency is larger than an average T0 of the aspect ratios of all the series arm resonators when the aspect ratio is defined as a ratio of the overlap width of electrode fingers of a series arm resonator to the number of pairs of the electrode fingers.

In accordance with the elastic-wave ladder filter according to a preferred embodiment of the present invention, an aspect ratio T2 of the series arm resonator having the highest resonant frequency is smaller than the average T0 of the aspect ratios of all the series arm resonators. In this case, loss within the passband can be reduced more effectively.

In accordance with the elastic-wave ladder filter according to another preferred embodiment of the present invention, the resonant frequency of the series arm resonator having the lowest resonant frequency is located within the passband in a frequency region lower than the central frequency of the passband, and the resonant frequency of the series arm resonator having the highest resonant frequency is located outside the passband in a frequency region higher than the passband. In this case, loss can be reduced more reliably.

The elastic-wave ladder filter according to various preferred embodiments of the present invention can use a surface-acoustic-wave filter, or can use boundary acoustic waves. Therefore, the present invention can provide both surface-acoustic-wave ladder filters and boundary-acoustic-wave ladder filters.

A duplexer according to a further preferred embodiment of the present invention includes a plurality of band-pass filters and at least one band-pass filter including an elastic-wave ladder filter according to one of the preferred embodiments of the present invention described above. Accordingly, loss in the duplexer can be reduced.

According to a elastic-wave ladder filter of various preferred embodiments of the present invention, the aspect ratio T1 of the series arm resonator having the lowest resonant frequency among the at least three series arm resonators having resonant frequencies that differ from each other is larger than the average T0 of the aspect ratios of all the series arm resonators. With this, loss, in particular, in the high frequency region of the passband can be sufficiently reduced at the same time as the passband and the attenuation can be increased by making the resonant frequencies different from each other.

Accordingly, preferred embodiments of the present invention provide a band-pass filter with a wide passband, a high attenuation, and a low loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will now be made clear by descriptions of specific preferred embodiments with reference to the drawings.

Figure 1:
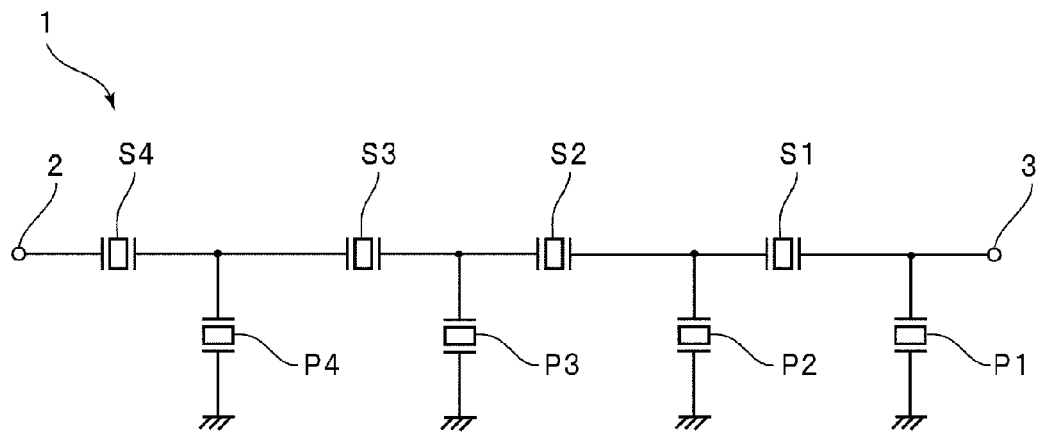
FIG. 1 illustrates a circuit configuration of an elastic-wave ladder filter according to a preferred embodiment of the present invention.

FIG. 1 illustrates a circuit configuration of an elastic-wave ladder filter according to a preferred embodiment of the present invention.

An elastic-wave ladder filter 1 includes a series arm that connects an input terminal 2 and an output terminal 3. The series arm includes a plurality of series arm resonators S1 to S4 connected to each other in series. The series arm resonator S4, the series arm resonator S3, the series arm resonator S2, and the series arm resonator S1 are aligned from the input terminal 2 to the output terminal 3 in this order.

A first parallel arm is arranged so as to connect a connection point between the output terminal 3 and the first series arm resonator S1 and a ground potential, and the first parallel arm includes a first parallel arm resonator P1.

Similarly, a second parallel arm that connects a connection point between the first series arm resonator S1 and the second series arm resonator S2 and a ground potential includes a second parallel arm resonator P2, a third parallel arm that connects a connection point between the second series arm resonator S2 and the third series arm resonator S3 and a ground potential includes a third parallel arm resonator P3, and a fourth parallel arm that connects a connection point between the third series arm resonator S3 and the fourth series arm resonator S4 and a ground potential includes a fourth parallel arm resonator P4.

Figure 2:
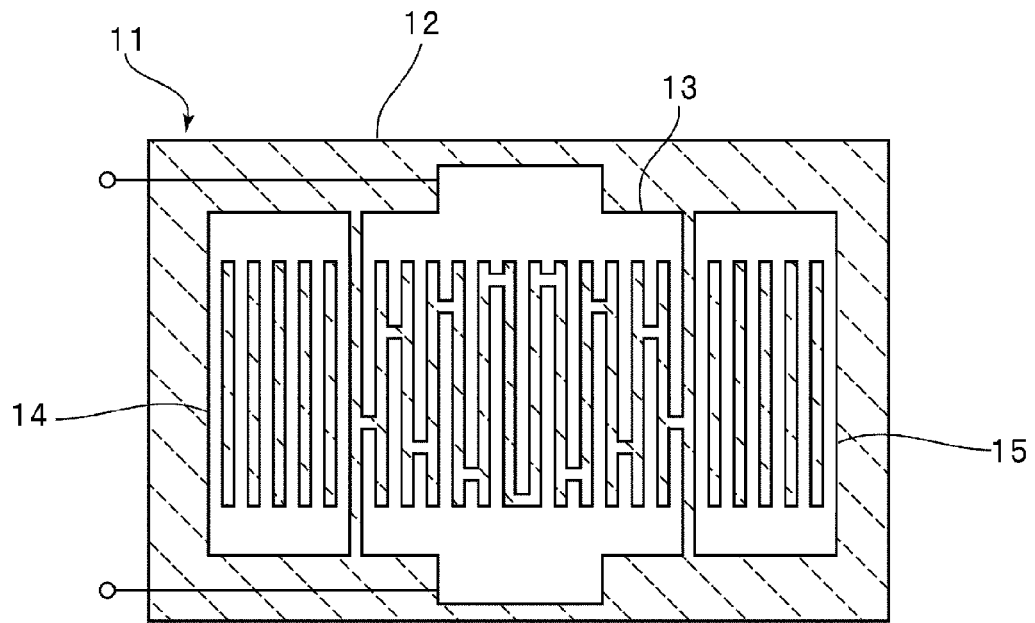
FIG. 2 is a schematic plan view of an elastic-wave resonator used in the elastic-wave ladder filter device shown in FIG. 1.

The series arm resonators S1 to S4 and the parallel arm resonators P1 to P4 preferably are one-port surface-acoustic-wave resonators in this preferred embodiment. FIG. 2 illustrates an example of a one-port surface-acoustic-wave resonator. In FIG. 2, a surface-acoustic-wave resonator 11 includes a piezoelectric substrate 12 and an IDT electrode 13 and reflectors 14 and 15 provided on the piezoelectric substrate 12.

As described above, the antiresonant frequency $fa_s$ of series arm resonators is set at an attenuation pole adjacent to a high frequency region of the passband, and the resonant frequency $fr_p$ of parallel arm resonators is set at an attenuation pole adjacent to a low frequency region of the passband in a ladder filter. Moreover, the resonant frequency $fr_s$ of the series arm resonators and the antiresonant frequency $fa_p$ of the parallel arm resonators are set within the passband. However, the resonant frequencies of the series arm resonators have been conventionally made different from each other so that the passband is increased.

In the elastic-wave ladder filter 1 according to this preferred embodiment, the resonant frequencies of the series arm resonators S1 to S4 are made different from each other so that the passband and the attenuation in the stopbands are increased.

Table 1 illustrates the resonant frequency, the antiresonant frequency, and the wavelength, which is determined by the pitch of the IDT electrode, of each of the first series arm resonator S1 to the fourth series arm resonator S4.

Table 1 also illustrates the number of pairs of electrode fingers, the overlap width of the electrode fingers, and the aspect ratio of the IDT electrode of each of the first series arm resonator S1 to the fourth series arm resonator S4 according to this preferred embodiment. Herein, the aspect ratio refers to a ratio of the overlap width of the electrode fingers to the number of pairs of the electrode fingers. That is, (aspect ratio)=(overlap width)/(number of pairs).

TABLE 1

|  | Resonant frequency (MHz) | Antiresonant frequency (MHz) | Wavelength (μm) | Example | | | Comparative example 1 | | | Comparative example 2 | | |
|  |  |  |  | No. of pairs | Overlap width | Aspect ratio | No. of pairs | Overlap width | Aspect ratio | No. of pairs | Overlap width | Aspect ratio |
| --- | --- | --- | --- | --- | --- | --- | --- | --- | --- | --- | --- | --- |
| S1 | 1921 | 2069 | 1.8473 | 156 | 27.8 | 0.18 | 213 | 20.4 | 0.10 | 258 | 16.8 | 0.07 |
| S2 | 1995 | 2163 | 1.7640 | 218 | 15.9 | 0.07 | 178 | 19.4 | 0.11 | 131 | 26.4 | 0.20 |
| S3 | 1942 | 2117 | 1.8091 | 247 | 19.8 | 0.08 | 209 | 23.4 | 0.11 | 180 | 27.2 | 0.15 |
| S4 | 1938 | 2095 | 1.8297 | 147 | 20.1 | 0.14 | 180 | 16.4 | 0.09 | 180 | 16.4 | 0.09 |

Table 2 illustrates the resonant frequency, the antiresonant frequency, and the wavelength, which is determined by the pitch of the IDT electrode, of each of the first parallel arm resonator P1 to the fourth parallel arm resonator P4. Table 2 also illustrates the number of pairs of the electrode fingers, the overlap width of the electrode fingers, and the aspect ratio of each of the parallel arm resonators P1 to P4.

TABLE 2

|  | Resonant frequency (MHz) | Antiresonant frequency (MHz) | Wavelength (μm) | No. of pairs | Overlap width | Aspect ratio |
| --- | --- | --- | --- | --- | --- | --- |
| P1 | 1812 | 1960 | 1.9607 | 90 | 38.9 | 0.43 |
| P2 | 1780 | 1940 | 1.9909 | 100 | 59.5 | 0.60 |
| P3 | 1820 | 1954 | 1.9602 | 74 | 31.7 | 0.43 |
| P4 | 1823 | 1854 | 1.9560 | 74 | 27.8 | 0.38 |

One of the unique features of the elastic-wave ladder filter 1 according to this preferred embodiment is that the aspect ratio T1 of the series arm resonator S1 having the lowest resonant frequency among the series arm resonators S1 to S4 is larger than an average T0 of the aspect ratios of all the series arm resonators S1 to S4, and as a result, loss, in particular, in a high frequency region of the passband can be sufficiently reduced. This will now be described with reference to a specific example.

LN substrates were used as piezoelectric substrates included in the series arm resonators S1 to S4 and the parallel arm resonators P1 to P4. In addition, the IDT electrodes each having the electrode fingers of the number of pairs, the overlap width, and the aspect ratio shown in Tables 1 and 2 were formed by patterning films mainly composed of, for example, Al, Cu, or Pt. Grating reflectors having 15 electrode fingers were also formed as the reflectors using the same material as the IDT electrodes.

For comparison, elastic-wave ladder filter devices were produced as Comparative Examples 1 and 2 so as to have the same structure as that according to the above-described preferred embodiment except that the IDT electrodes of the series arm resonators S1 to S4 each had the electrode fingers of the number of pairs, the overlap width, and the aspect ratio shown in Table 1.

In the elastic-wave ladder filter according to the above-described preferred embodiment, the aspect ratio T1 of the series arm resonator S1 was larger than T0 since T1=0.18 and T0=0.12.

Moreover, in Comparative Example 1, T1 was equal to T0 since T1=0.01 and T0=0.10. Furthermore, in Comparative Example 2, T1 was less than T0 since T1=0.07 and T0=0.13.

Figure 3:
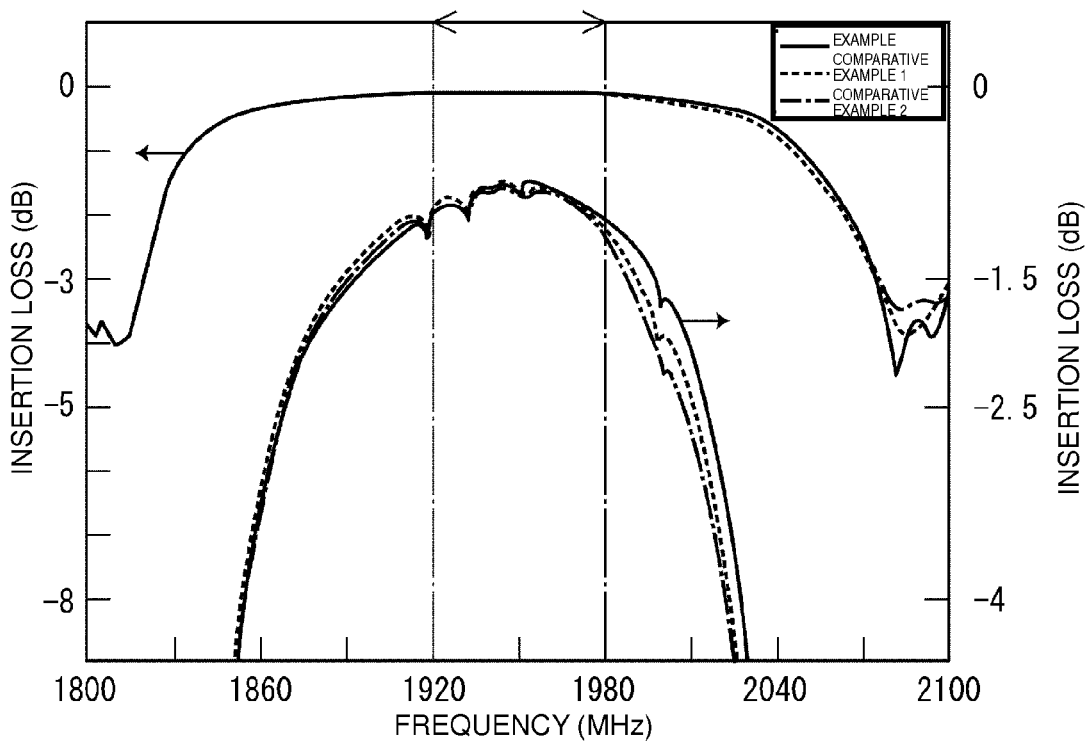
FIG. 3 illustrates the insertion loss characteristic of the elastic-wave ladder filter according to a preferred embodiment of the present invention and those of elastic-wave ladder filters according to comparative examples 1 and 2.

FIG. 3 illustrates the insertion loss characteristic of the elastic-wave ladder filter of an example according to the above-described preferred embodiment and those of the elastic-wave filters according to Comparative Examples 1 and 2. In FIG. 3, solid lines indicate results of the example, broken lines indicate results of Comparative Example 1, and alternate long and short dash lines indicate results of Comparative Example 2.

As is clear from FIG. 3, loss in a high frequency region within the passband was not markedly increased in accordance with this preferred embodiment while loss in the vicinity of 1,980 MHz, which is a higher end of the passband, within the passband was increased in Comparative Examples 1 and 2. This could lead to a significant reduction in the loss in the high frequency region within the passband.

This could be because the return loss characteristic of the series arm resonator S1 in the high frequency region within the passband was improved since the aspect ratio T1 of the series arm resonator S1 having the lowest resonant frequency among the series arm resonators S1 to S4 whose resonant frequencies differ from each other was increased compared with the average T0 of the aspect ratios of all the series arm resonators as described below. This will be made clear with reference to FIGS. 4 to 11.

The inventor discovered that the reduction in the loss in the vicinity of the higher end of the passband within the passband was caused by the effect of the return loss characteristic of the series arm resonator S1 having the lowest resonant frequency. That is, the inventor supposed and confirmed that the return loss characteristic of the series arm resonator S1 having the lowest resonant frequency and that of the series arm resonator S2 having the highest resonant frequency affected loss in filter characteristics in the high frequency region of the passband.

FIGS. 4 to 7 illustrate the impedance characteristics, the phase characteristics, the impedance Smith charts, and the return loss (RL) characteristics, respectively, of the series arm resonator S1 having the lowest resonant frequency when the aspect ratio was preferably set to about 0.07 or about 0.15, for example. In FIGS. 4 to 7, solid lines indicate the case where the aspect ratio was about 0.15, and broken lines indicate the case where the aspect ratio was about 0.07.

Figure 4:
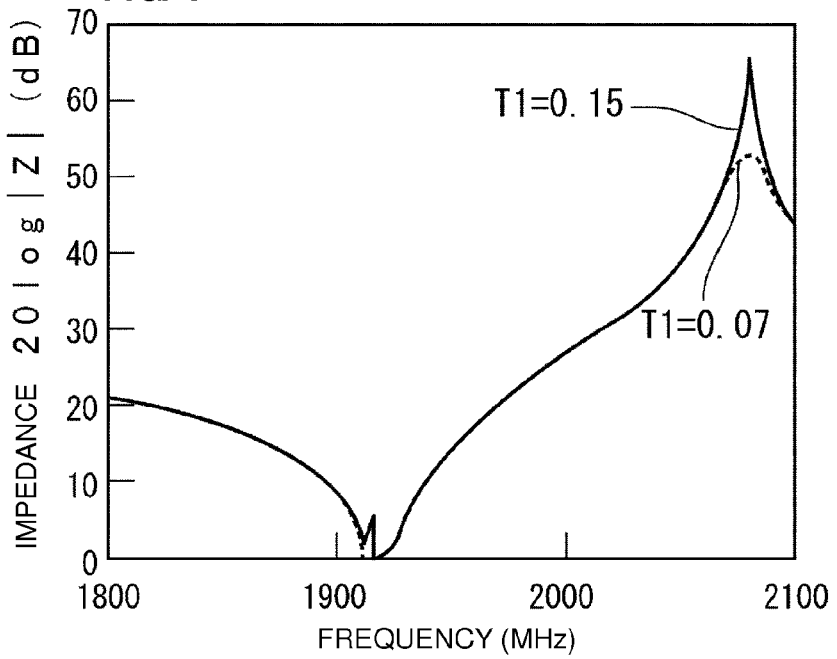
FIG. 4 illustrates the impedance characteristics of a series arm resonator having the lowest resonant frequency when the aspect ratio was set to about 0.07 or about 0.15.
Figure 5:
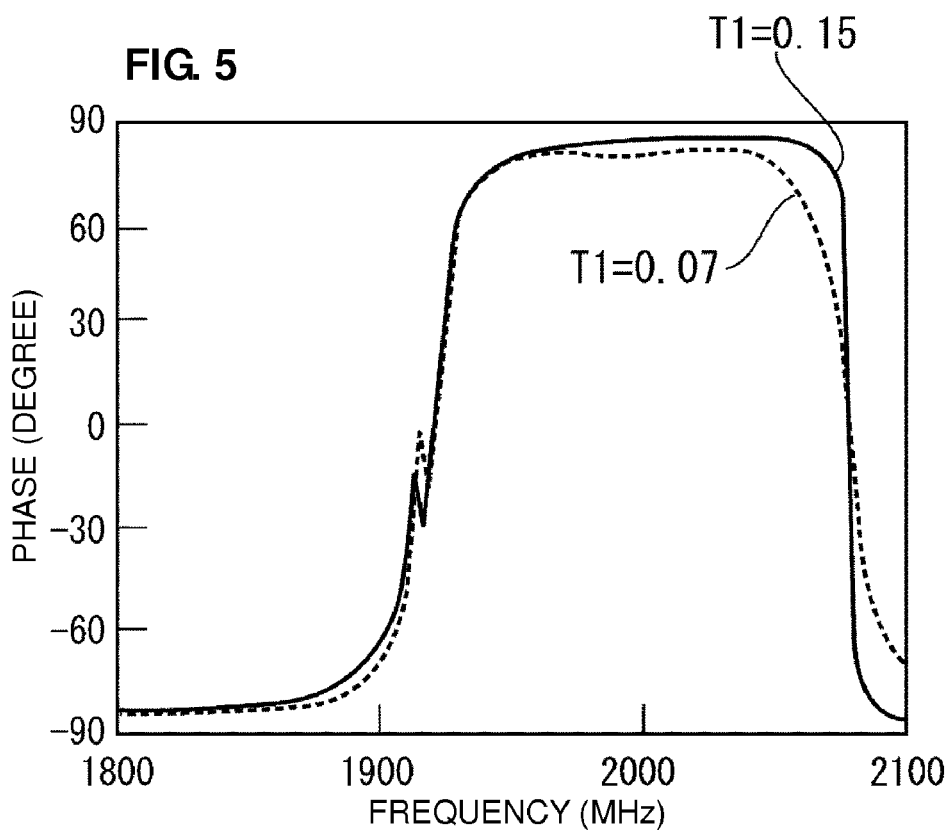
FIG. 5 illustrates the phase characteristics of the series arm resonator having the lowest resonant frequency when the aspect ratio was set to about 0.07 or about 0.15.
Figure 6:
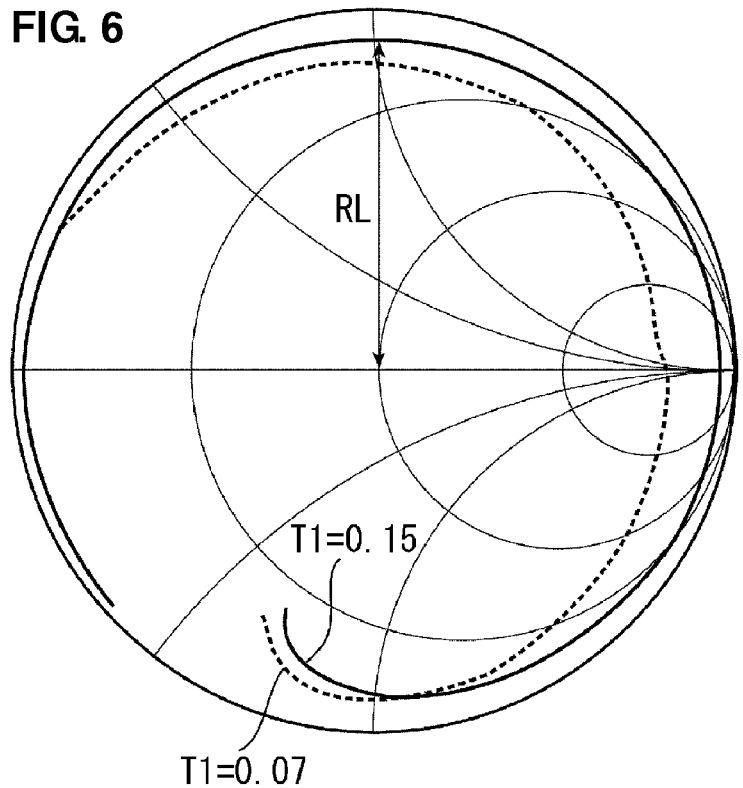
FIG. 6 illustrates the impedance Smith charts of the series arm resonator having the lowest resonant frequency when the aspect ratio was set to about 0.07 or about 0.15.
Figure 7:
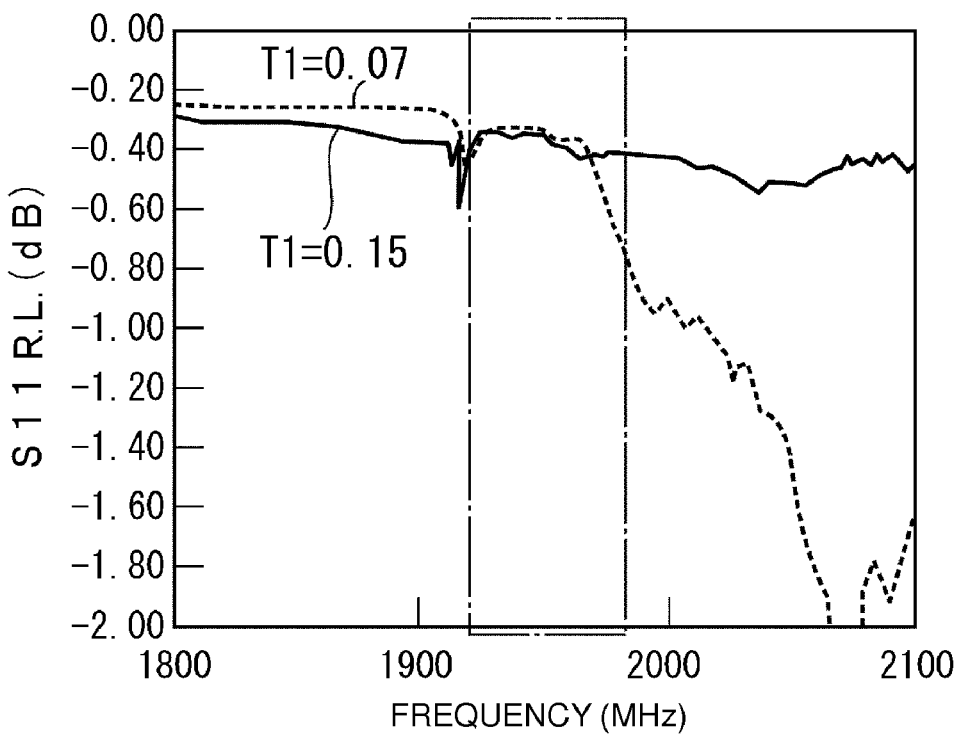
FIG. 7 illustrates the return loss characteristics of the series arm resonator having the lowest resonant frequency when the aspect ratio was set to about 0.07 or about 0.15.
Figure 8:
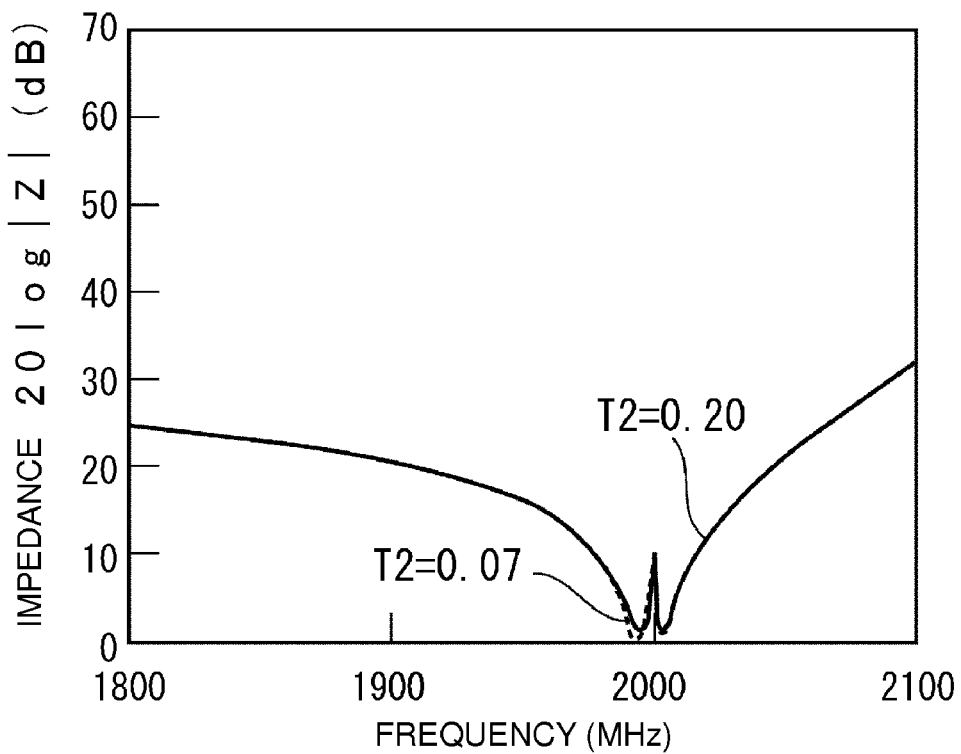
FIG. 8 illustrates the impedance characteristics of a series arm resonator having the highest resonant frequency when the aspect ratio was set to about 0.07 or about 0.20.
Figure 9:
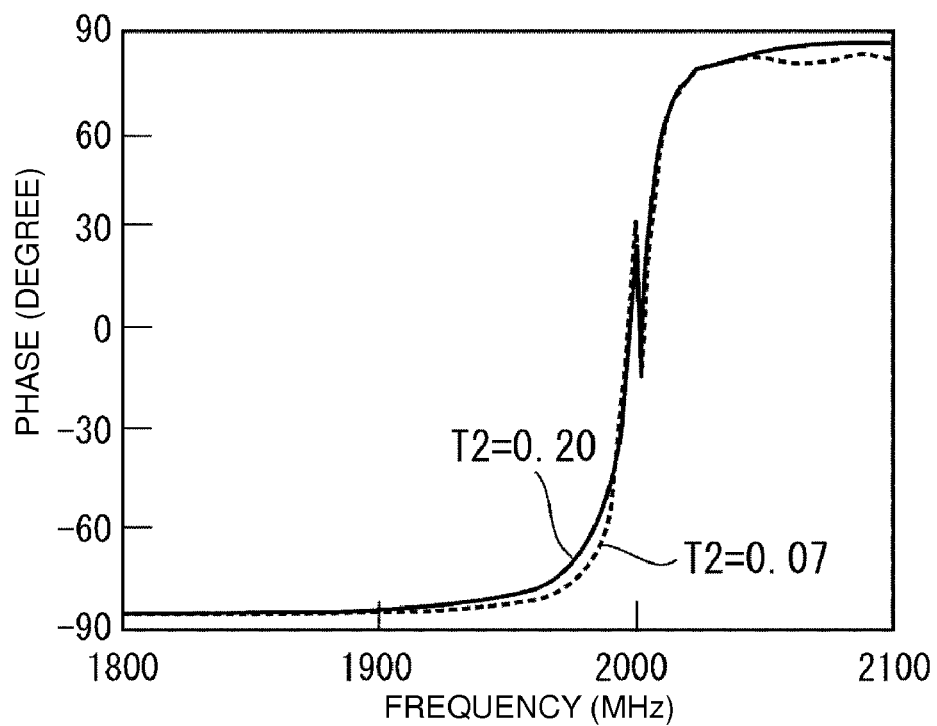
FIG. 9 illustrates the phase characteristics of the series arm resonator having the highest resonant frequency when the aspect ratio was set to about 0.07 or about 0.20.
Figure 10:
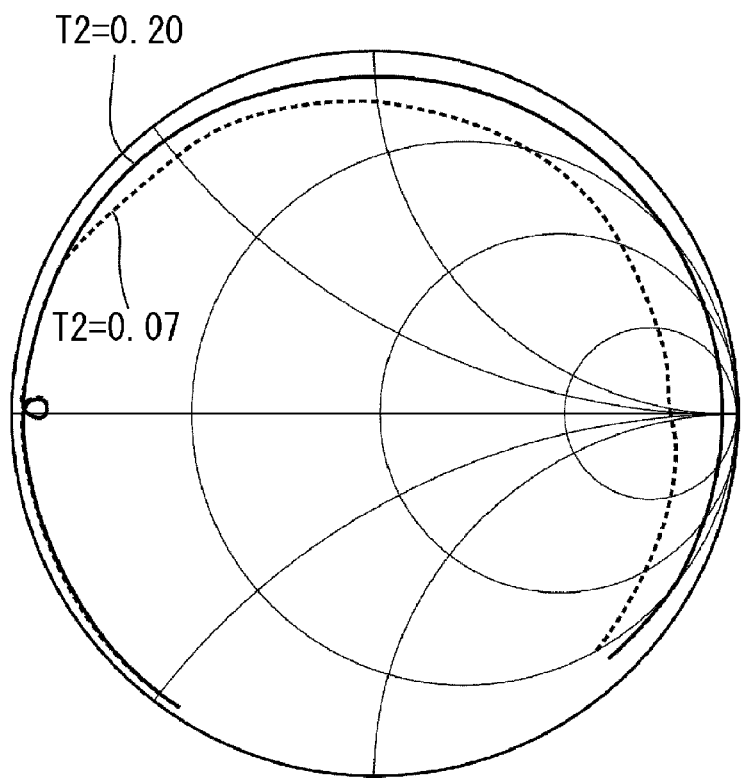
FIG. 10 illustrates the impedance Smith charts of the series arm resonator having the highest resonant frequency when the aspect ratio was set to about 0.07 or about 0.20.
Figure 11:
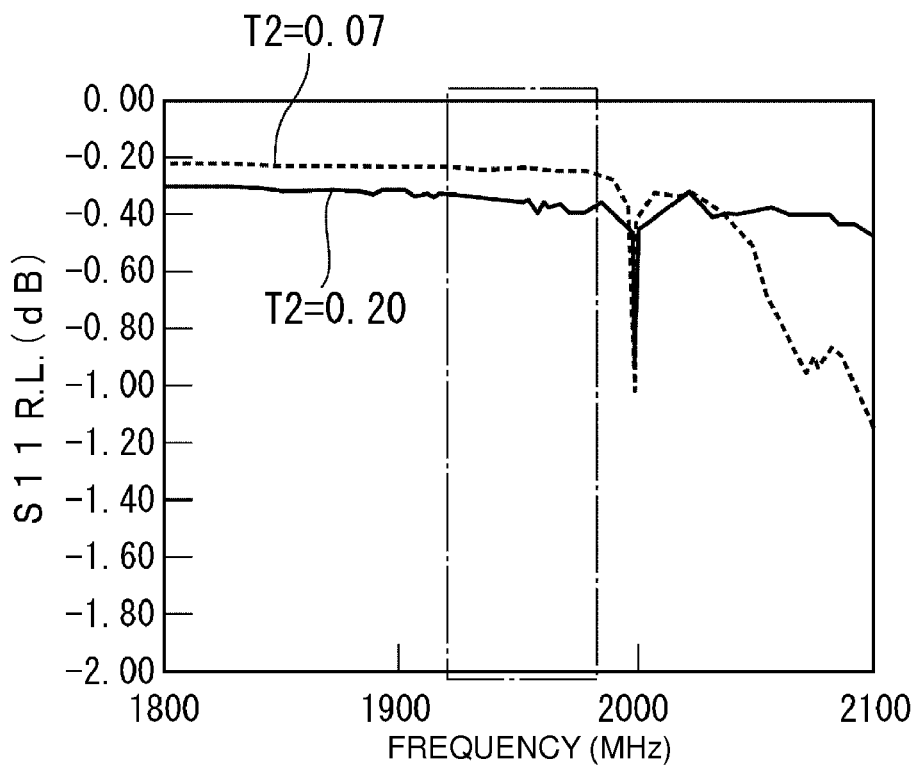
FIG. 11 illustrates the return loss characteristics of the series arm resonator having the highest resonant frequency when the aspect ratio was set to about 0.07 or about 0.20.

As shown in FIGS. 4 to 6, the antiresonance characteristics of the series arm resonator S1 were improved when the aspect ratio of the series arm resonator S1 was increased to about 0.15 compared with when the aspect ratio was about 0.07. Moreover, as shown in FIG. 7, the return loss in the high frequency region within the passband was also improved.

That is, it was discovered that the return loss in the high frequency region within the passband would also be adversely affected when the antiresonance characteristics were degraded by the diffraction loss since the antiresonant frequency of the series arm resonator S1 having the lowest resonant frequency was located adjacent to the passband of 1,920 MHz to 1,980 MHz.

Therefore, the diffraction loss was reduced by increasing the overlap width of the series arm resonator S1 so that the antiresonance characteristics were improved. At this moment, the number of pairs of the electrode fingers was reduced in accordance with the increase in the overlap width so that the electrostatic capacitance of the elastic-wave resonator did not change. That is, the aspect ratio was increased.

On the other hand, FIGS. 8 to 11 illustrate the impedance characteristics, the phase characteristics, the impedance Smith charts, and the return loss characteristics, respectively, of the series arm resonator S2 having the highest resonant frequency when the aspect ratio was about 0.07 or about 0.20, for example. Solid lines indicate the case where the aspect ratio was about 0.20, and broken lines indicate the case where the aspect ratio was about 0.07.

As is clear from FIGS. 8 to 11, the resonance characteristics could be improved when the aspect ratio of the series arm resonator S2 having the highest resonant frequency was reduced to about 0.07 compared with the case where the aspect ratio was about 0.20. Although the antiresonance characteristics of the second series arm resonator S2 were degraded due to the reduction in the overlap width, the return loss was degraded in a frequency region higher than the resonant frequency as described above. As a result, the return loss within the passband was improved.

As is clear from the results shown in FIGS. 4 to 7 and FIGS. 8 to 11, the aspect ratio of the first series arm resonator S1 having the lowest resonant frequency affected the loss in the high frequency region of the passband of the elastic-wave ladder filter 1 when the passband was increased using the series arm resonators S1 to S4 whose resonant frequencies differ from each other.

The resonant frequency of the series arm resonator S2 having the highest resonant frequency was set at a frequency higher than the passband, and the antiresonant frequency was set at an even higher frequency. Therefore, it is conceivable that the degradation of the antiresonance characteristics of the series arm resonator S2 caused by the diffraction loss had little effect on the return loss within the passband. Therefore, the overlap width of the series arm resonator S2 was reduced the most so that the resistance loss was reduced and so that the resonance characteristics were improved. Moreover, the number of pairs of the electrode fingers was increased in accordance with the reduction in the overlap width so that the electrostatic capacitance of the elastic-wave resonator did not change. That is, the aspect ratio of the series arm resonator S2 was reduced as in the preferred embodiment shown in Table 1.

In this preferred embodiment, the antiresonance characteristics were improved by increasing the aspect ratio of the first series arm resonator S1 having the lowest resonant frequency as shown in FIGS. 4 to 7, and at the same time, the return loss in the high frequency region within the passband was improved as shown in FIG. 7 as described above.

Moreover, although the resonance characteristics of the series arm resonator S1 were degraded by increasing the overlap width, the return loss between the resonance characteristics and the antiresonance characteristics, that is, in the frequency region higher than the resonant frequency was not degraded compared with the return loss in the frequency region lower than the resonant frequency since the antiresonance characteristics were improved in this preferred embodiment. The return loss within the passband was not easily degraded in the first series arm resonator S1 having the lowest resonant frequency since the passband was located in a frequency region higher than the resonant frequency.

As a result of investigation in which the aspect ratio T1 of the series arm resonator S1 and the aspect ratios of the other series arm resonators S2 to S4 were variously changed, it was confirmed that the loss in the high frequency region of the passband could be sufficiently reduced at the same time as the passband and the attenuation can be increased when T1>T0 as shown in FIG. 3.

In addition, the aspect ratio T2 of the series arm resonator S2 having the highest resonant frequency was, for example, about 0.07, which was smaller than T0=0.12, in the above-described preferred embodiment. Therefore, the loss in the high frequency region within the passband could be further reduced.

Although an elastic-wave ladder filter including surface-acoustic-wave resonators using surface acoustic waves has been described in the above-described preferred embodiment, the present invention can be incorporated in a boundary-acoustic-wave device using boundary acoustic waves and including elastic-wave resonators. In other words, the elastic-wave ladder filter according to a preferred embodiment of the present invention can include a boundary-acoustic-wave ladder filter.

Figure 12:
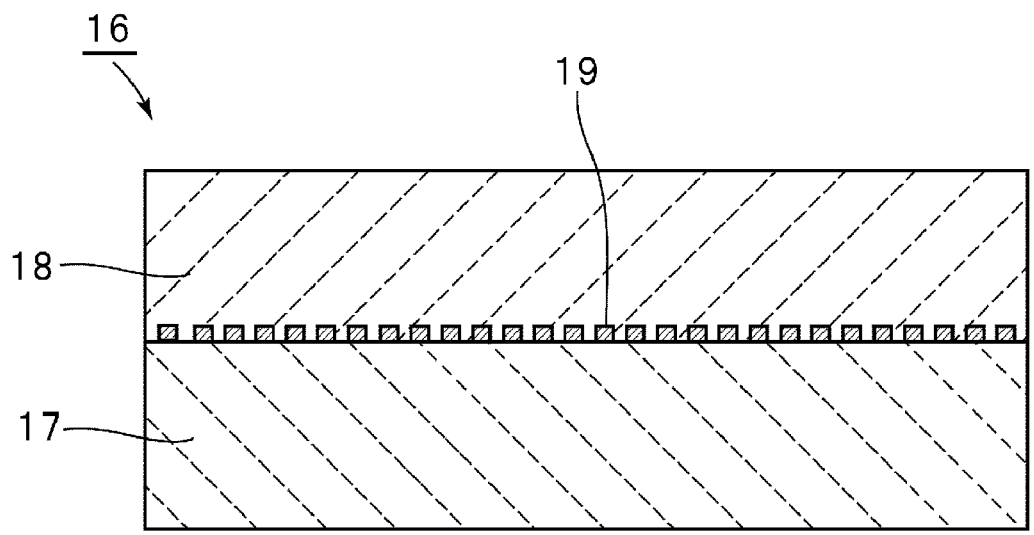
FIG. 12 is a schematic cross-section viewed from the front illustrating a boundary-acoustic-wave device serving as an elastic-wave filter device in which a preferred embodiment of the present invention is incorporated.

That is, a boundary-acoustic-wave device 16 shown in a schematic cross-section viewed from the front in FIG. 12 includes a piezoelectric substrate 17 and a dielectric 18 stacked thereon. An electrode structure 19 including an IDT is provided at the interface between the piezoelectric substrate 17 and the dielectric 18. A boundary-acoustic-wave filter device can be provided in accordance with a preferred embodiment of the present invention by forming electrode structures according to the above-described preferred embodiment as the electrode structure 19.

Figure 13A:
FIGS. 13A and 13B illustrate circuit configurations of duplexers in which a preferred embodiment of the present invention is incorporated.
Figure 13A:
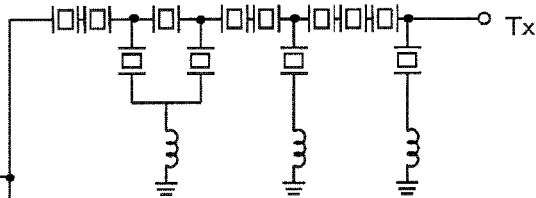
Figure 13B:
Figure 13B:
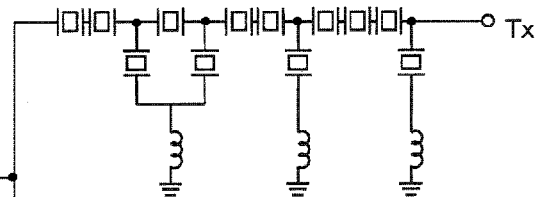

Moreover, the elastic-wave ladder filter according to a preferred embodiment of the present invention can be preferably used as a band-pass filter of a duplexer including a plurality of band-pass filters. Duplexers 21 and 22 shown in FIGS. 13A and 13B, respectively, each include a transmit filter TX and a receive filter RX as the plurality of band-pass filters. Loss in the duplexers 21 and 22 can be reduced when the elastic-wave ladder filter according to a preferred embodiment of the present invention is used as the RX filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic-wave ladder filter comprising:
   a series arm that connects an input end and an output end; and
   a parallel arm that connects the series arm and a ground potential; wherein
   the series arm includes at least three series arm resonators connected to each other in series, resonant frequencies of the at least three series arm resonators differ from each other, and an aspect ratio of the series arm resonator having a lowest resonant frequency is larger than an aspect ratio of every one of the other series arm resonators when the aspect ratio is defined as a ratio of an overlap width of electrode fingers of a series arm resonator to a number of pairs of the electrode fingers; and
   an aspect ratio of the series arm resonator having a highest resonant frequency is smaller than an average of the aspect ratios of all of the series arm resonators.

2. The elastic-wave ladder filter according to claim 1, wherein the filter is a surface-acoustic-wave filter.

3. The elastic-wave ladder filter according to claim 1, wherein the filter is a boundary-acoustic-wave filter.

4. A duplexer comprising:
   at least two filters, wherein
   at least one of the at least two filters is an elastic-wave ladder filter according to claim 1.

5. An elastic-wave ladder filter comprising:
   a series arm that connects an input end and an output end; and
   a parallel arm that connects the series arm and a ground potential; wherein
   the series arm includes at least three series arm resonators connected to each other in series, resonant frequencies of the at least three series arm resonators differ from each other, and an aspect ratio of the series arm resonator having a lowest resonant frequency is larger than an average of aspect ratios of all the series arm resonators when the aspect ratio is defined as a ratio of an overlap width of electrode fingers of a series arm resonator to a number of pairs of the electrode fingers; and
   the resonant frequency of the series arm resonator having the lowest resonant frequency is located within a passband in a frequency region lower than a central frequency of the passband, and the resonant frequency of the series arm resonator having the highest resonant frequency is located outside the passband in a frequency region higher than the passband.

6. The elastic-wave ladder filter according to claim 5, wherein the filter is a surface-acoustic-wave filter.

7. The elastic-wave ladder filter according to claim 5, wherein the filter is a boundary-acoustic-wave filter.

8. A duplexer comprising:
   at least two filters, wherein
   at least one of the at least two filters is an elastic-wave ladder filter according to claim 5.

* * * * *